United States Patent
Vignal et al.

(10) Patent No.: US 10,270,382 B2
(45) Date of Patent: Apr. 23, 2019

(54) PANEL, ASSEMBLY OF PANELS AND ASSOCIATED ROOF

(71) Applicant: ArcelorMittal, Luxembourg (LU)

(72) Inventors: Renaud Vignal, Sevrier (FR); Laurent Geron, Cerexhe-Heuseux (BE); Paul Wouters, Liege (BE)

(73) Assignee: ArcelorMittal, Luxembourg (LU)

( * ) Notice: Subject to any disclaimer, the term of this patent is extended or adjusted under 35 U.S.C. 154(b) by 0 days.

(21) Appl. No.: 15/576,552

(22) PCT Filed: May 26, 2015

(86) PCT No.: PCT/IB2015/000742
§ 371 (c)(1),
(2) Date: Nov. 22, 2017

(87) PCT Pub. No.: WO2016/189341
PCT Pub. Date: Dec. 1, 2016

(65) Prior Publication Data
US 2018/0159462 A1 Jun. 7, 2018

(51) Int. Cl.
*H02S 20/30* (2014.01)
*H02S 20/23* (2014.01)
(Continued)

(52) U.S. Cl.
CPC ............... *H02S 20/23* (2014.12); *E04D 3/30* (2013.01); *F24S 25/40* (2018.05); *H01L 31/042* (2013.01);
(Continued)

(58) Field of Classification Search
CPC ............. F24S 25/40; H02S 20/23; E04D 3/30
See application file for complete search history.

(56) References Cited

U.S. PATENT DOCUMENTS 5,164,020 A * 11/1992 Wagner ................... E04D 3/366
    136/244
6,365,824 B1 * 4/2002 Nakazima ............. H01L 31/048
    136/244
(Continued)

FOREIGN PATENT DOCUMENTS

DE      202011050085 U1   7/2011
FR         2951529 A1     4/2011
(Continued)

OTHER PUBLICATIONS

Corresponding Search Report for International Application No. PCT/IB2015/000742.

*Primary Examiner* — Paola Agudelo
(74) *Attorney, Agent, or Firm* — Davidson, Davidson & Kappel, LLC

(57) ABSTRACT

The present invention provides a panel. The panel includes an upper transverse edge having an upper overlap area intended to be covered by an adjacent panel and a lower transverse edge having a lower overlap area intended to covered by an adjacent panel. The panel also includes a first longitudinal edge having a first longitudinal rib, a central part, extending from the first longitudinal rib, having a recess located in the upper overlap area which has an opening for flush mounting an electrical junction box and a perforation located in the lower overlap area for passing through an electrical connector. The panel further includes a second longitudinal edge extending from the central part and having a second longitudinal rib. The first longitudinal rib and the second longitudinal rib have shapes enabling them to overlap.

18 Claims, 4 Drawing Sheets

(51) Int. Cl.
*E04D 3/30* (2006.01)
*F24S 25/40* (2018.01)
*H01L 31/042* (2014.01)
*H02S 30/00* (2014.01)
*H02S 40/44* (2014.01)

(52) U.S. Cl.
CPC .............. *H02S 30/00* (2013.01); *H02S 40/44* (2014.12); *Y02B 10/12* (2013.01); *Y02B 10/20* (2013.01); *Y02E 10/47* (2013.01)

(56) References Cited

U.S. PATENT DOCUMENTS

| | | | |
|---|---|---|---|
| 6,856,496 B1 | 2/2005 | Mucci et al. | |
| 7,837,020 B2 | 11/2010 | Mackie et al. | |
| 8,021,905 B1 | 9/2011 | Nath et al. | |
| 8,276,329 B2 | 10/2012 | Lenox | |
| 9,410,325 B2* | 8/2016 | Koehler | F24J 2/5228 |
| 9,812,016 B2 | 11/2017 | Chabas et al. | |
| 2006/0266405 A1 | 11/2006 | Lenox | |
| 2009/0255530 A1 | 10/2009 | Gunter | |
| 2010/0281794 A1* | 11/2010 | Saillard | F24J 2/4612 |
| | | | 52/173.3 |
| 2011/0041888 A1* | 2/2011 | Levine | E04D 3/352 |
| | | | 136/244 |
| 2011/0162639 A1* | 7/2011 | Jeandeaud | F24J 2/4645 |
| | | | 126/634 |
| 2013/0160382 A1* | 6/2013 | Schick | F24J 2/5228 |
| | | | 52/173.3 |
| 2013/0291456 A1* | 11/2013 | Desloover | E04D 1/08 |
| | | | 52/173.3 |
| 2014/0224303 A1* | 8/2014 | Herwig | H01L 31/0488 |
| | | | 136/251 |
| 2017/0005610 A1* | 1/2017 | Sabban | H02S 20/23 |
| 2017/0155357 A1 | 6/2017 | Vignal et al. | |
| 2017/0155359 A1 | 6/2017 | Vignal et al. | |
| 2018/0152135 A1 | 5/2018 | Vignal et al. | |
| 2018/0152136 A1 | 5/2018 | Vignal et al. | |

FOREIGN PATENT DOCUMENTS

| | | |
|---|---|---|
| JP | 11210174 A | 8/1999 |
| JP | 2011241648 | 12/2011 |
| JP | 2013209808 A | 10/2013 |
| WO | WO0077860 A2 | 12/2000 |
| WO | 2009090347 A2 | 7/2009 |
| WO | WO2009090347 | 7/2009 |
| WO | 2013029793 A1 | 3/2013 |
| WO | WO2013029793 A1 | 3/2013 |
| WO | 2016189342 A1 | 12/2016 |
| WO | 2016189343 A1 | 12/2016 |

\* cited by examiner

PANEL, ASSEMBLY OF PANELS AND ASSOCIATED ROOF

The present invention relates to a panel, intended for the construction of building envelopes, and more particularly intended to be assembled for the construction of roofs of buildings bearing photovoltaic cells, without being limited thereto.

BACKGROUND

Roof coverings are known to be made of ribbed panels, e.g., of precoated galvanised steel, with overlapping edges that ensure the watertightness of the roof.

In particular, from WO200909090347, it is also known that solar modules, particularly photovoltaic modules, are described as roof coverings for buildings. These may include modules in the form of flexible strips attached with adhesive to the surface of the wave troughs of the ribbed panel. In the future, photovoltaic devices may also be produced directly on the surface of the wave troughs of the ribbed panel, in particular by vacuum or atmospheric pressure deposition methods. These modules are connected to each other by a network of cables, preferably located at the front of the roof, so as to avoid premature deterioration of the cables and to maintain the aesthetics of the building.

SUMMARY OF THE INVENTION

However, such an arrangement has the disadvantage of compromising the watertightness of the roof, as the cables on the rear side of the roof usually require a hole to be made on the surface of the ribbed panel.

Such an arrangement also has the disadvantage of requiring access to the roof underlayment to ensure that two successive modules are connected at the rear of the ribbed panels.

Such an arrangement also has the disadvantage of some of the photovoltaic cells being in the shadow of the ribs of the panel when the angle of incidence of solar rays on the roof is low. This accordingly reduces the performance of the photovoltaic system.

In addition, there is also a need for ribbed photovoltaic roofing panels that facilitate the installation of roofing and wiring of photovoltaic modules.

An object of the invention is to overcome the aforementioned watertightness problem by providing a ribbed panel whose profile is configured such that the watertightness is maintained, while facilitating the installation of roofing and cabling of photovoltaic modules.

Another object of the invention is to overcome the problems of the aforementioned shadows by proposing a ribbed panel whose profile is configured such that the photovoltaic cells are not in the shadows of the ribs under the vast majority of lighting conditions.

The present invention provides a panel comprising:
an upper transverse edge comprising an upper overlap area intended to be covered by an adjacent panel,
a lower transverse edge comprising a lower overlap area intended to cover an adjacent panel
a first longitudinal edge comprising a first longitudinal rib,
a central part, extending from the first longitudinal rib, comprising:
a recess located in the upper overlap area and comprising an opening for mounting an electrical junction box,
a perforation in the lower overlap area for passing through an electrical connector,
a second longitudinal edge extending from the central part and comprising a second longitudinal rib, the first longitudinal rib and the second longitudinal rib having shapes enabling them to overlap.

The panel according to the invention may also comprise the following optional features, taken individually or in combination:
the central part is flat,
the central part successively comprises a first base plate of width L13, at least one projecting part and a second base plate of width L15, the first base plate and the second base plate being located in a plane P,
the projecting part comprises an upper plate of height H16 and width L16 and two side web plates extending from the upper plate on both sides thereof and downward at an angle $\beta$ with plane P,
the first longitudinal rib comprises a rib apex of height H8 and width L8 and two lateral base plates extending from the rib apex on both sides thereof and downward, the two lateral base plates forming an angle $\alpha$ with plane P and wherein the second longitudinal rib comprises a rib apex of height H11 and width L11 and two lateral base plates extending from the rib apex on both sides thereof and downward to form an angle $\gamma$ with plane P,
widths L13, L15, heights H8, H11, H16 and angles $\alpha$, $\beta$, $\gamma$ satisfy the following relations:

$$H16/H8 \geq 0.4$$

$$H16 \geq ((H8 \times (ab-be) - L13 \times abe)/(ae+ab))$$

$$H16 \geq ((H11 \times (cb-be) - L15 \times cbe)/(ce+cb))$$

With a=tan $\alpha$, b=tan $\beta$, c=tan $\gamma$ and e=tan 20°,
the ratio of length L16 to length L8 is greater than or equal to 5 and the ratio of length L16 to length L11 is greater than or equal to 5,
the central part comprises at least two projecting parts separated by two intermediate base plates of length L18 located in plane P framing a central rib comprising a rib apex of height H20 and two lateral base plates extending from the rib apex on both sides thereof downward and outward forming an angle $\delta$ with plane P,
width L18, heights H16, H20 and angles $\beta$ and $\delta$ satisfy the following relation:

$$H16 \geq ((H20 \times (db-be) - L18 \times dbe)/(de+db))$$

With b=tan $\beta$, d=tan $\delta$ and e=tan 20°,
the panel has a width L1 and the ratio of the sum of the widths L16 of the upper plates to the width L1 of the panel is greater than or equal to 0.5,
the upper plate is covered with photovoltaic cells,
the photovoltaic cells are assembled in the form of flexible strips glued to the upper plate,
the photovoltaic cells are built directly on the upper plate by vacuum deposition methods,
the recess extends to the upper transverse edge of the panel,
the recess is centered laterally on the upper plate,
the opening is located in the upper half of the upper overlap area,
the perforation is located in the lower quarter of the lower overlap area.

The present invention further provides a roof comprising a marginal overlap assembly of at least two panels according to the invention.

Other features and advantages of the invention will appear in the following description.

BRIEF DESCRIPTION OF THE DRAWINGS

The invention will be better understood from reading the following description, given by way of non-limiting example, with reference to the appended figures that show.

DETAILED DESCRIPTION

The same reference numbers identify the same elements in different figures.

Throughout the text, a panel is defined as an element with a flat shape, i.e., of low thickness relative to its other dimensions. The panel may be in the form of a plate or sheet composed of a single material or a composite assembly. In the latter case, the panel is a superposition of several layers of the same materials or different materials. The material in question may be, among other things, a metallic material, a polymer or a ceramic. Examples of metallic materials include, but are not limited to, steel, aluminum, copper and zinc. Preferably the panel is a metal sheet. Preferably it is pre-galvanized and precoated steel to protect it from corrosion. The panel may optionally be coated with foam.

In the context of the invention, the panel has been previously shaped by any known shaping method, among which folding, shaping, stamping, and moulding are examples that are not restrictive.

This shaping leads to the formation of ribs on the panel surface. Throughout the text, a rib is defined as a protrusion formed on the surface of a panel. The rib may be trapezoidal-shaped, as in the following examples, or be rectangular, corrugated, sinusoidal or omega-shaped, for example. It comprises a rib apex and two lateral base plates.

To form a roof or facade, panels are assembled by marginal overlapping of their longitudinal and transverse edges and attached to the supporting structure of the building by means of fasteners such as screws, nails, or rivets.

Throughout the text, a photovoltaic module is defined as a set of photovoltaic cells connected to each other, preferably in series, and isolated from the outside by a protective barrier. This may include, but is not limited to, a module in the form of a flexible strip glued to the central part of the panel or a module built directly on the central part of the panel by successive deposition of layers of suitable nature by vacuum or atmospheric pressure deposition methods.

Within each photovoltaic module, the arrangement and organization of photovoltaic cells is not limited. By way of non-limiting example, cells may be arranged under each other in a single row of cells or arranged in several rows, the rows being connected to each other to form a kind of folded ribbon. Preferably, and in order to facilitate the construction of photovoltaic modules directly on the panel by vacuum or atmospheric pressure deposition methods, the cells are arranged in a single row.

In the context of the invention, the photovoltaic module comprises an electric pole at one longitudinal end and an electric pole of opposite polarity at the other end.

Figure 1:
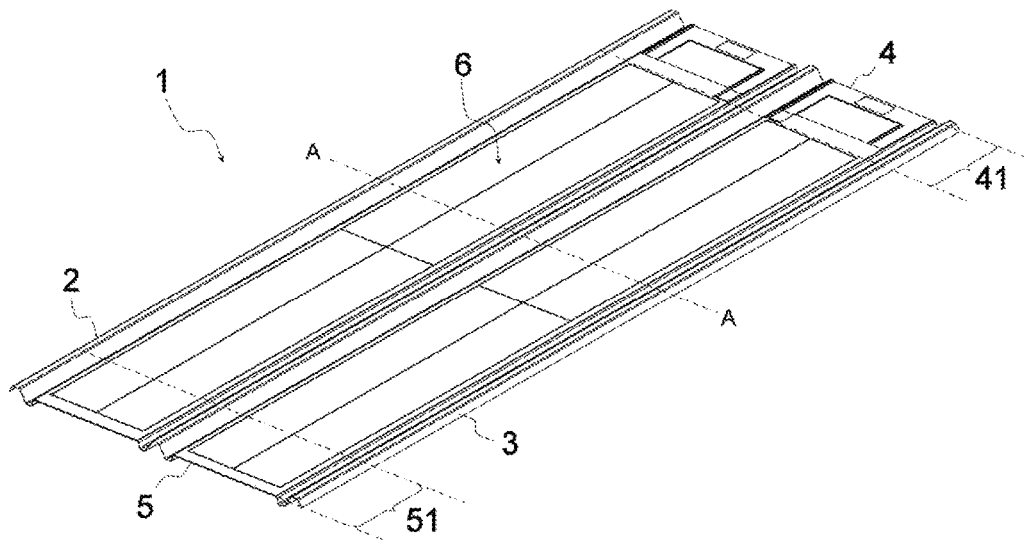
FIG. 1 is a perspective view of a panel according to the invention.

With reference to FIG. 1, panel 1 mainly comprises a first longitudinal edge 2, a second longitudinal edge 3, an upper transverse edge 4, a lower transverse edge 5, the four edges being connected by a central part 6 intended to be covered with photovoltaic modules.

Upper transverse edge 4 comprises an upper overlap area 41 intended to be covered by an adjacent panel during roof assembly. This upper overlap area generally has a width between 150 and 500 mm, depending on the slope of the roof, among other things.

Lower transverse edge 5 comprises a lower overlap area 51 intended to cover an adjacent panel during roof assembly. This lower overlap area generally has a width between 150 and 500 mm, depending on the slope of the roof, among other things.

Figure 2:
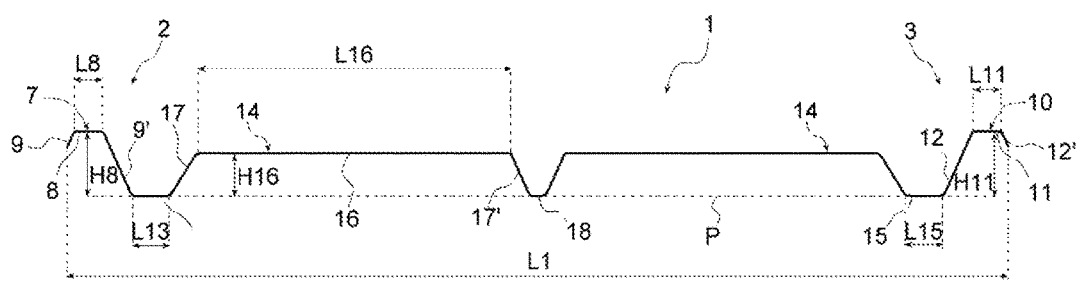
FIG. 2 is a cross-section of a panel according to the invention.
Figure 3:
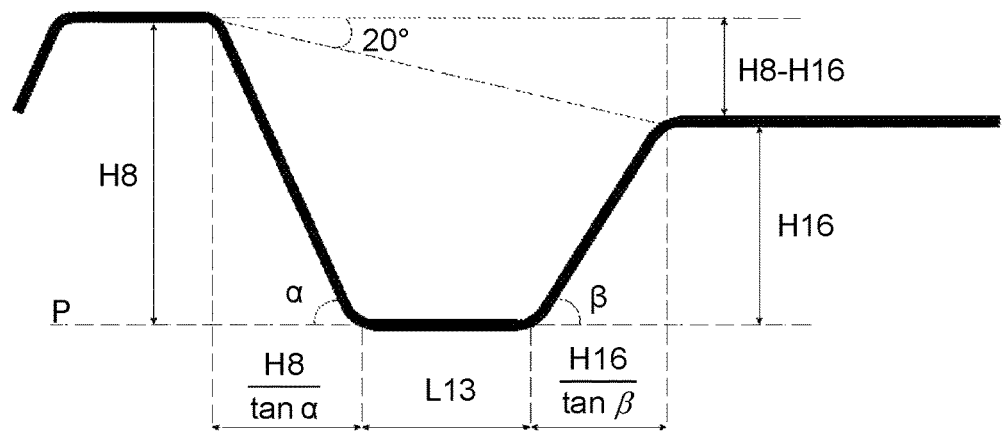
FIG. 3 is a detail of FIG. 2.

With reference to FIGS. 2 and 3, first longitudinal edge 2 and second longitudinal edge 3 will be described. Panel 1 is shown in cross-section by A-A in FIG. 1. This section is located outside overlap areas 41 and 51.

Firstly, first longitudinal edge 2 comprises a first longitudinal rib 7 including a rib apex 8 of height H8 and width L8 and two lateral base plates 9, 9' extending from rib apex 8 on both sides and downward to form an angle $\alpha$ with plane P. Here, height H8 refers to the distance between plane P and the highest point of the rib apex.

Plane P is the plane wherein panel 1 rests when it is laid flat on a support.

First longitudinal rib 7 serves to attach the panel to the structure of the building at the wave crest of the panel but not at the wave trough. This prevents water stagnation in the vicinity of the fasteners and thus prevents possible failure of the roof waterproofing.

In this example, rib apex 8 is flat and lateral base plates 9, 9' are inclined, extending downward and outward from rib apex 8, with angle $\alpha$ being acute. In the context of the invention, first longitudinal rib 7 may, of course, have shapes other than the one described in this example. Lateral base plate 9' of longitudinal rib 7 may in particular be truncated, as in the case of FIG. 2, or not truncated, depending on the desired mechanical strength of this part of the panel.

Second longitudinal edge 3 comprises a second longitudinal rib 10 including a rib apex 11 of height H11 and width L11 and two lateral base plates 12, 12' extending from the rib apex 11 on both sides and downward to form an angle $\gamma$ with plane P. Height H11 here refers to the distance between plane P and the highest point of the rib apex H11.

The function of the second longitudinal rib is to be covered by the first longitudinal rib of the adjacent panel during assembly of the two panels. As a result, height H11 is less than or equal to height H8 of the first longitudinal rib. The shapes of the first and second longitudinal ribs are adjusted accordingly. Preferably, the shapes are adjusted so that watertightness is ensured when panels are used for roofing. Preferably, the two ribs have the same shape and size so that the overlap is perfectly contiguous and therefore perfectly waterproof. However, in the context of the invention, the overlap may only be locally contiguous. A person skilled in the art who has expert knowledge of these water-tightness issues will know how to adapt the shapes of the two longitudinal ribs according to the desired aesthetics while ensuring the watertightness of the assembly.

According to the example shown in FIGS. 2 and 3, two longitudinal ribs 7, 10 have the same trapezoidal shape, with the lateral base plates extending downward and outward, and lateral base plates 9, 12' being truncated. The two longitudinal ribs thus overlap in a perfectly contiguous manner, which contributes to the watertightness of the roof.

Central part 6 is located in the extension of first longitudinal rib 7 and second longitudinal rib 10.

According to a first embodiment of the invention, central part 6 is flat.

According to a second embodiment of the invention, central part 6 is mainly flat and comprises longitudinal stiffeners evenly distributed over the entire central part.

Figure 4:
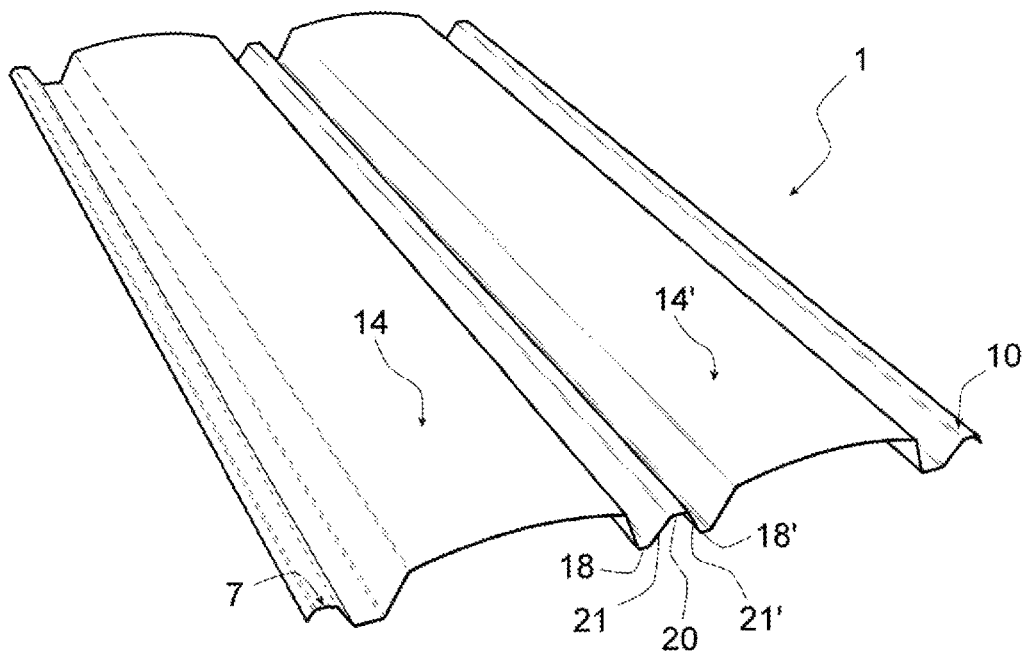
FIG. 4 is a perspective view of a panel according to an embodiment of the invention.

According to a third embodiment of the invention illustrated in FIGS. 2 and 4, central part 6 successively comprises a first base plate 13, at least one projecting part 14 and a second base plate 15. First base plate 13, of width L13, is located in plane P in the extension of lateral base plate 9' of first longitudinal rib 7. Second base plate 15, of width L15, is located in plane P in the extension of lateral base plate 12 of second longitudinal rib 10. Projecting part 14 comprises an upper plate 16 of height H16 and width L16 and two side web plates 17, 17' extending from the upper plate on both sides thereof and downward, forming an angle β with plane P. Height H16 here refers to the distance between plane P and the lateral end of the upper plate, i.e., the intersection point of the upper plate and a side web.

Projecting part 14 serves, in particular, to incorporate a junction box and/or connectors between upper plate 16 and plane P. When the panel is placed on the load-bearing structure of the building by sliding base plates 13 and 15 onto the supporting structure, the junction box and/or connectors do not interfere with sliding.

According to the example shown in FIG. 2, central part 6 comprises two projecting parts 14 separated by an intermediate base plate 18. However, central part 6 may comprise an additional number of projecting parts 14, separated by intermediate base plates 18.

According to the example shown in FIG. 4, central part 6 comprises two projecting parts 14. They are separated by two intermediate base plates 18, 18' of length L18 located in plane P framing a central rib 19 comprising a rib apex 20 of height H20 and two side base plates 21, 21' extending from the rib apex on both sides of the rib downward and outward, forming an angle δ with plane P. This central rib makes it possible on the one hand to increase the mechanical strength of the panel and on the other hand to attach the center of the panel to the load-bearing structure of the building, with base plates 13, 13' constituting support points for the panel on this structure.

Upper plate 16 is intended to be covered with photovoltaic cells. Examples include modules in the form of flexible strips glued to the surface of upper plate 16 or photovoltaic modules built directly on the surface of plate 16 by vacuum or atmospheric pressure deposition methods. To this end, and in order to obtain a significant photovoltaic coverage rate, plate 16 preferably has a large size compared to rib apex 8, 11 of the longitudinal ribs and occupies a significant portion of the panel. Thus, preferably:

the ratio of width L16 of upper plate 16 to width L8 of rib apex 8 is greater than or equal to 5,
the ratio of width L16 of upper plate 16 to width L11 of rib apex 11 is greater than or equal to 5.

Preferably, in order to obtain a panel largely covered with photovoltaic cells, the ratio of the sum of widths L16 of upper plates 16 of all projecting parts 14 of central part 6 to width L1 of the panel is greater than or equal to 0.5.

The orientation of side web plates 17, 17' may also increase the photovoltaic coverage rate. In the case of FIG. 2, the side web plates 17, 17' are inclined, extending downward and outward from upper plate 16. However, other configurations are possible; for example, side web plates 17, 17' may extend below and inward from upper plate 16, with angle β being obtuse, so as to minimize the distance between the lateral end of upper plate 16 and the lateral end of rib 8 or 11 and thus maximize the available surface area for photovoltaic cells.

With reference to FIG. 4, the portion of central part 6 located in upper overlap area 41 comprises a recess 22, i.e., a central part area beneath the surface of the rest of central part 6. In the context of the embodiment wherein the central part comprises at least one projecting part 14, recess 22 is located in the part of upper plate 16 located in upper overlap area 41.

This recess is intended to enable the electrical wiring of the photovoltaic modules to be incorporated without compromising the watertightness of the assembly of two adjacent panels. In particular, it enables to integrate a junction box capable of electrically connecting, on the one hand, an electrical terminal of a photovoltaic module located on the central part 6 of the panel and, on the other hand, the opposite polarity electrical terminal of a photovoltaic module located on central part 6 of the adjacent panel covering the upper overlap area of the first panel. Recess 22 may also be used to integrate the corresponding electrical connections or connectors.

To this end, recess 22 does not extend beyond upper overlap area 41. Thus rain running off the roof is thereby prevented from entering the recess.

Preferably, the depth of the recess is adjusted to the dimensions of the junction box and connectors so that panel 1 may be covered contiguously by an adjacent panel at upper overlap area 41. In particular, the depth of the recess is such that the top of the junction box and the top of the connectors connecting the junction box to the photovoltaic modules do not extend beyond the perimeter of the recess.

Recess 22 comprises an opening 23 for flash mounting an electrical junction box. The dimensions of the opening are adapted to the electrical junction box provided for this purpose. In particular, the dimensions are adjusted by taking into account thermal expansion and loads that may be exerted on the panel during its use. According to a embodiment of the invention, the opening has dimensions 2 mm larger than the junction box.

The lower transverse edge of opening 23 is preferably located as close as possible to the upper transverse edge of the panel. This ensures that the opening is maximally distant from the lower limit of upper overlap area 41, which facilitates maintaining good roof watertightness. In fact, any upwelling of water due to capillary action in the gap formed by the upper overlap area of the lower panel and the lower overlap area of the upper panel does not run the risk of reaching the opening. The lower transverse edge of opening 23 preferably lies in the upper half of upper overlap area 41. More preferably, the lower transverse edge of opening 23 is no more than 150 mm from the upper transverse edge of the panel.

The shape of recess 22 is not restrictive. According to the embodiment shown in FIG. 5, the recess is U-shaped. Opening 23 is centered transversely on upper plate 16 and the branches of the U extend to the vicinity of side web plates 17, 17'. This U-shape allows the junction box to be flush-mounted in the middle, i.e., it may be centered transversely on center part 6, or if necessary on upper plate 16, and connected to the longitudinal edges of the photovoltaic modules by means of connectors arranged in the branches of the U.

Figure 6:
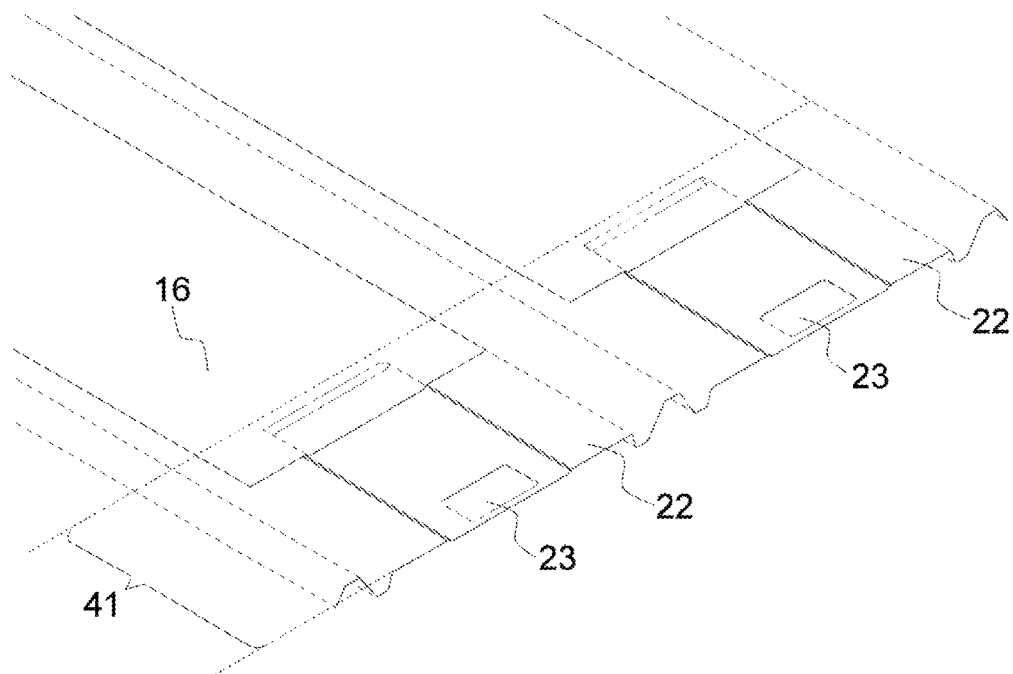
FIG. 6 is a perspective view of the upper overlap area of a panel according to another emobodiment of the invention.

According to another embodiment of the invention illustrated in FIG. 6, recess 22 has a rectangular shape and is centered transversely on upper plate 16. This form allows the junction box to be flush-mounted in the middle and connects the box to the central parts of the photovoltaic modules by means of connectors, which are also arranged in the central part.

Recess 22 may be obtained by stamping central part 6 or by any other shaping technique known to a person skilled in the art and adapted to the situation.

Opening 23 may be obtained by any cutting technique known to a person skilled in the art, including, but not limited to, punching, milling, mechanical cutting, laser cutting, water cutting, and oxygen cutting.

Figure 7:
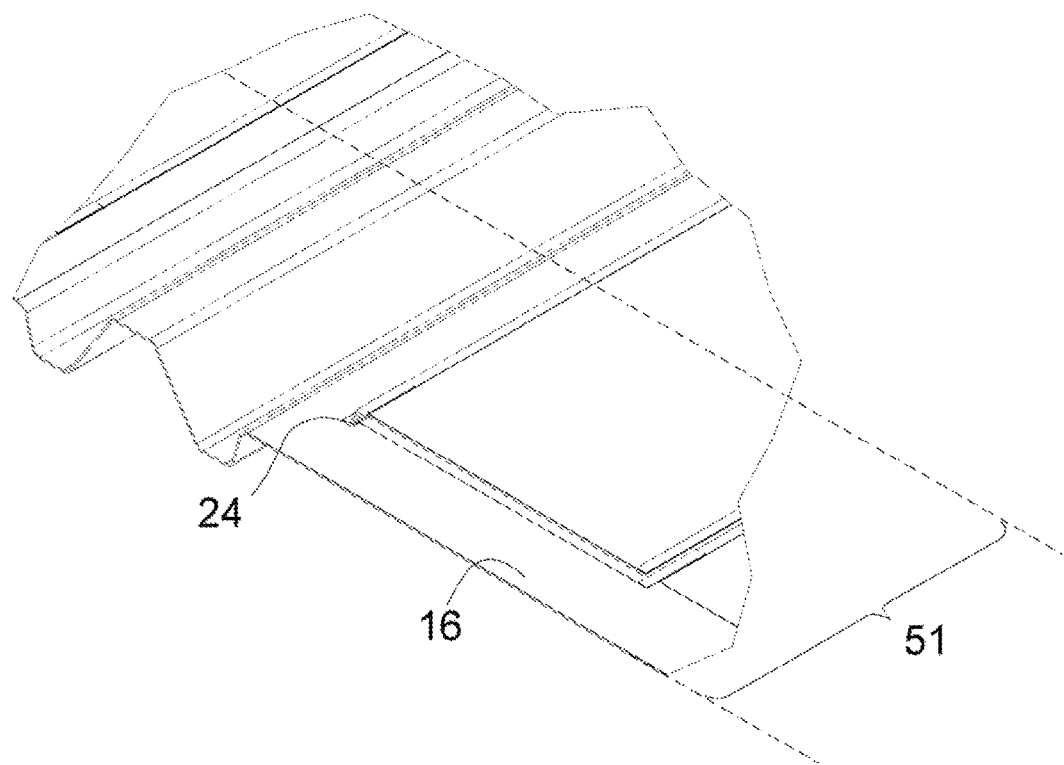
FIG. 7 is a perspective view of the lower overlap area of a panel according to an emobodiment of the invention.

With reference to FIG. 7, the portion of central part 6 located in lower overlap area 51 comprises a perforation 24, i.e., an opening made in the thick area of the central part. In the context of the embodiment wherein the central part comprises at least one projecting part 14, perforation 24 is located in the part of upper plate 16 located in the lower overlap area 51.

This perforation is intended to enable the integration of the electrical wiring of photovoltaic modules without compromising the watertightness of the assembly of two adjacent panels. In particular, perforation 24 allows the electrical connection between one photovoltaic module's electrical terminals and the junction box embedded in opening 23 of the adjacent panel whose lower overlap area is located below the perforation.

To this end, the perforation does not extend beyond the lower overlap area 51. Thus, if rain from roof runoff were to pass through the perforation as a result of inadequate waterproofing, water would be contained in the upper overlap area 41 of the adjacent panel and continue to flow along the roof. The roof watertightness is thereby maintained.

According to a embodiment of the invention, perforation 24 is located as close as possible to the lower transverse edge of the panel, preferably in the lower quarter of the lower overlap area 51 of the panel. In this way, the perforation is maximally distant from the upper transverse edge of the adjacent panel, which is partially covered by the lower overlap area of the panel, thereby facilitating maintenance of good watertightness of the panel assembly. In fact, a possible upwelling of water due to capillary action from the rear of a perforation 24 with inadequate watertightness of a first panel is unlikely to reach opening 23, at some distance away, of a second panel partially covered by the first panel.

According to another embodiment of the invention, perforation 24 is located in the upper two-thirds of lower overlap area 51 of the panel. Perforation 24 is thus largely covered by photovoltaic cells, which contributes to good watertightness at the level of the perforation. Preferably, perforation 24 is positioned so that it is plumb with opening 23 of an adjacent panel when lower overlap area 51 of the panel just covers upper overlap area 41 of the adjacent panel. Such positioning makes it possible to easily connect the two panels electrically without the need for a sophisticated electrical connection.

The geometry and dimensions of perforation 23 are not restrictive. They are adjusted so that the perforation may be covered:

on the upper side, by means of a photovoltaic module, the connection between the upper side and the photovoltaic module, such as an adhesive, acting as a waterproofing membrane on the perimeter of the perforation, on the lower side, by means of a connector, the connection between the lower side and the connector, such as an adhesive, acting as a watertight membrane around the perimeter of the perforation, According to a embodiment of the invention, the perforation is a small rectangle whose dimensions are adapted to connectors available on the market.

Preferably, the lateral positioning of perforation 23 is adjusted such that the perforation is positioned so that it is plumb with an electrical terminal of the photovoltaic module covering central part 6 or, if necessary, upper plate 16.

Perforation 23 may be obtained by any cutting technique known to a person skilled in the art, including, but not limited to, punching, milling, mechanical cutting, laser cutting, water cutting, and oxygen cutting.

According to the embodiment of the invention wherein central part 6 comprises at least one projecting part 14, the profile of panel 1 is also configured so that the photovoltaic cells do not fall in the shadow of the ribs under the vast majority of lighting conditions.

Figure 5:
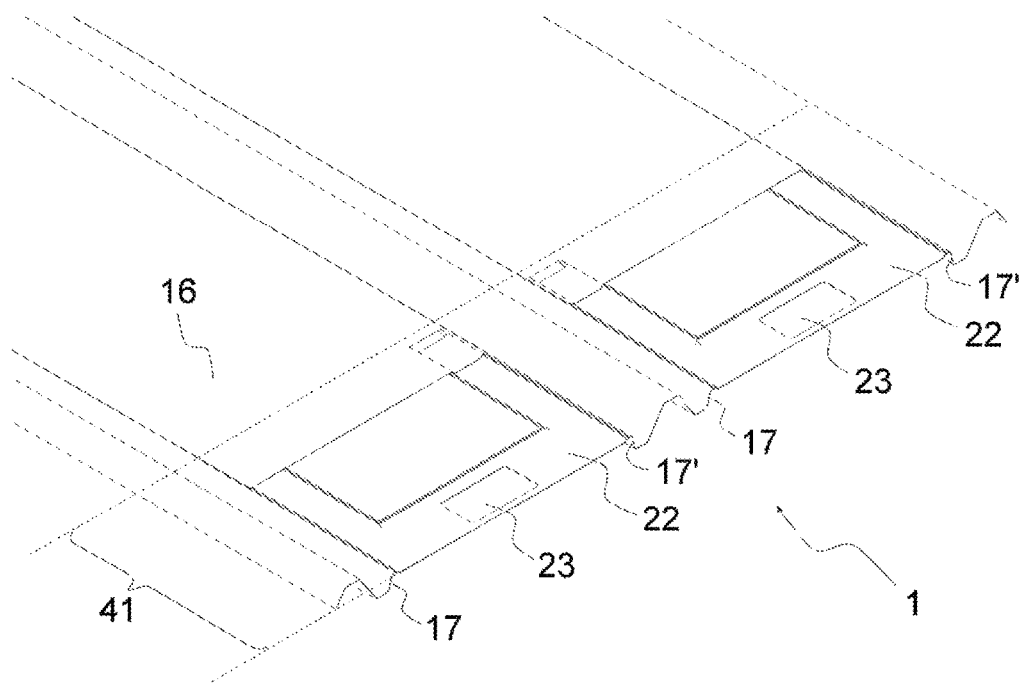
FIG. 5 is a perspective view of the upper overlap area of a panel according to an embodiment of the invention.

In particular, the height of the upper plate, the height of the upper central parts, the width of the base plates and the angles $\alpha$, $\beta$ and $\gamma$ are configured in such a way that no part of the photovoltaic cells covering the upper plate is in the shadow of the first and second longitudinal ribs when solar rays make an angle greater than or equal to 20° with plane P. To this end, within the context of the invention:

$$H16/H8 \geq 0,4 \qquad (1)$$

$$H16 \geq ((H8 \times (ab-be) - L13 \times abe)/(ae+ab)) \qquad (2)$$

$$\text{and } H16 \; ((H11 \times (cb-be) - L15 \times cbe)/(ce+cb)) \qquad (3)$$

with a=tan $\alpha$, b=tan $\beta$, c=tan $\gamma$ and e=tan 20° the inequalities (2) and (3) result from the expression for the tangent of the 20° angle as shown in FIG. 5.

The 20° angle corresponds to the acceptable limit in terms of energy losses due to shade; these losses represent only a small percentage of the energy received by the photovoltaic cells.

For an H16/H8 ratio less than 0.4, satisfying inequalities (2) and (3) would require the use of oversized base plates 13 and 15, which is incompatible with the goal of obtaining a panel largely covered with photovoltaic cells.

According to one embodiment, ratios H16/H8 and H16/H11 are less than or equal to 0.6 such that most of upper plate 16 does not extend above rib apex 8, 11 even when the upper plate is bent, as will be described. Thus watertightness is better maintained, as water flowing from the upper plate cannot reach the longitudinal edges of the panel, at the level of the marginal overlap between two panels Preferably, inequalities (2) and (3) are satisfied for e=tan 15° and even more preferentially for e=tan 10°. Thus the photovoltaic cells covering the upper plate are not in the shadow of the first and second longitudinal ribs when the angle of solar rays is particularly low.

Even more preferentially, the photovoltaic cells covering the upper plate are never in the shadow of the first and second longitudinal ribs, regardless of the angle of incidence of solar rays. This condition is met when height H16 of upper plate 16 is greater than or equal to height H8 of rib apex 8 and greater than or equal to height H11 of rib apex 11. In other words, this condition is satisfied when inequalities (1) to (3) are replaced by the following inequalities:

$$H16 \geq H8 \qquad (4)$$

and H16≥H11 (5)

More preferentially, height H16 of upper plate 16 is strictly higher than height H8 of rib apex 8 and is strictly higher than height H11 of rib apex 11. In other words, this condition is met when inequalities (1) to (3) are replaced by the following inequalities:

H16>H8 (6)

and H16>H11 (7)

Thus, not only are the photovoltaic cells covering the upper plate never in the shadow of the first and second longitudinal ribs, regardless of the angle of incidence of solar rays, but such a configuration also makes it possible to envisage the addition of photovoltaic cells in the upper part of lateral web plates 17, 17' of projecting part 14, i.e., in the side web plates, which are never in the shadow of the longitudinal ribs. This increases the photovoltaic coverage rate of the panel. This also facilitates cleaning photovoltaic cells, as the longitudinal ribs do not interfere with the photovoltaic cells of two adjacent plates.

According to the embodiment of the invention wherein central part 6 comprises two projecting parts 14 separated by two base plates 18', 18' and a central rib 19, the base plates and the central rib are preferably configured in such a way that the photovoltaic cells covering upper plate 16 are not in the shadow of the central rib when the angle of incidence of solar rays is at an angle greater than or equal to 20° with plane P. To this end, width L18, heights H16, H20 and angles β and δ satisfy the following relation:

$$H16 \geq ((H20 \times (db-be) - L18 \times dbe)/(de+db))$$ (8)

With b=tan β, d=tan δ and e=tan 20°

According to one embodiment, the H16/H20 ratio is greater than 0.4, which avoids the need for oversized base plates 18.

According to one embodiment, the H16/H20 ratio is 0.6 or less, so that most of the upper plate does not protrude above rib apex 20 of rib 19 even when the upper plate 16 is bent. This better maintains the watertightness of the roof, since water flowing from the upper plate cannot reach rib apex 20 where the means of attachment to the load-bearing structure of the building are located.

Preferably, inequality (8) is satisfied for e=tan 15°, and even more preferentially for e=tan 10°. This means that the photovoltaic cells covering the upper plate are not in the shadow of the central rib when the angle of incidence of solar rays is particularly low.

More preferentially, photovoltaic cells covering the upper plate are never in the shadow of the central rib, regardless of the angle of incidence of solar rays. This condition is met when inequality (8) is expressed as follows:

H16≥H20

Even more preferentially, height H16 of upper plate 16 is strictly higher than height H20 of rib apex 20. Thus, not only are the photovoltaic cells covering the upper plate never in the shadow of the central rib, regardless of the angle of incidence of solar rays, but such a configuration also makes it possible to envisage the addition of photovoltaic cells in the upper part of the lateral web plates 17, 17' of projecting part 14, i.e., in the side web plates, which are never in the shadow of the central rib. This increases the photovoltaic coverage rate of the panel. This also facilitates cleaning photovoltaic cells, as central rib 19 does not interfere with the photovoltaic cells of two adjacent plates.

In the example shown in FIG. 4, rib apex 20 of the central rib is of the same height as rib apex 8 of the first longitudinal rib.

Preferably, and always for the purpose of avoiding shadows on photovoltaic cells, upper plate 14 is flat and horizontal as shown in FIG. 2. This ensures that no part of the plate cast a shadow on any other part of the plate. However, in the context of the invention, however, the plate is only approximately flat, i.e., slightly concave or slightly convex. "Slightly concave" and "slightly convex" here means that the bending of the plate is such that no part of the plate is in the shadow of another part of the plate when solar rays make an angle greater than or equal to 20° with plane P. This corresponds to a radius of curvature of the plate greater than or equal to 1.4 times width L14 of the upper plate, i.e., a radius of curvature of 400 mm for a width L14 of about 275 mm. This bending of the plate makes it possible to increase the mechanical strength of the projecting part. The upper plate is rigidified and does not collapse when loaded.

According to the example shown in FIG. 4, the upper plate is slightly concave with a radius of curvature of the plate approximately 1.8 times width L16 of the upper plate.

It is obvious that features presented in support of embodiments are independent of each other and that, as a result, other combinations of these features, i.e. other panel profiles, are possible.

What is claimed is:

1. A panel comprising:
   an upper transverse edge including an upper overlap area intended to be covered by an adjacent panel;
   a lower transverse edge including a lower overlap area intended to cover a further adjacent panel;
   a first longitudinal edge including a first longitudinal rib;
   a central part extending from the first longitudinal rib, including:
     a recess located in the upper overlap area including an opening; and
     a perforation in the lower overlap area for passing through an electrical connector; and
   a second longitudinal edge extending from the central part including a second longitudinal rib,
   the first longitudinal rib and the second longitudinal rib having shapes enabling them to overlap.

2. The panel according to claim 1, wherein the central part is flat.

3. The panel according to claim 1, wherein the central part comprises, in succession, a first base plate of a width L13, at least one projecting part and a second base plate of a width L15, the first base plate and the second base plate being located in a plane P.

4. The panel according to claim 3, wherein the projecting part comprises an upper plate of a height H16 and a width L16 and two side web plates extending from the upper plate on both sides thereof and downward at an angle β with respect to the plane P.

5. The panel according to claim 4, wherein the first longitudinal rib comprises a rib apex of height H8 and width L8 and two lateral base plates extending from the rib apex on both sides thereof and downward, the two lateral base plates forming an angle α with plane P and wherein the second longitudinal rib comprises a rib apex of a height H11 and a width L11, and two lateral base plates extending from the rib apex on both sides thereof and downward to form an angle γ with plane P.

6. The panel according to claim 5, wherein widths L13, L15, heights H8, H11, H16 and angles α, β, γ satisfy the following:

$H16/H8 \geq 0.4;$ $H16 \geq ((H8 \times (ab-be) - L13 \times abe)/(ae+ab));$ and $H16 \geq ((H11 \times (cb-be) - L15 \times cbe)/(ce+cb));$ with a=tan α, b=tan β, c=tan γ and e=tan 20°.

7. The panel according to claim 4, wherein a ratio of length L16 to length L8 is greater than or equal to 5 and the ratio of length L16 to length L11 is greater than or equal to 5.

8. The panel according to claim 4, wherein the central part includes at least two projecting parts separated by two intermediate base plates of a length L18 located in plane P framing a central rib comprising a rib apex of a height H20 and two lateral base plates extending from the rib apex on both sides thereof downward and outward forming an angle δ with plane P.

9. The panel according to claim 8, wherein width L18, heights H16, H20 and angles β and δ satisfy the following:

$H16 \geq ((H20 \times (db-be) - L18 \times dbe)/(de+db))$ with b=tan β, d=tan δ and e=tan 20°.

10. The panel according to claim 4, having a width L1, wherein a ratio of the sum of widths L16 of the upper plates to the width L1 of the panel is greater than or equal to 0.5.

11. The panel according to claim 4, wherein the upper plate is covered with photovoltaic cells.

12. The panel according to claim 11, wherein the photovoltaic cells are assembled in a form of flexible strips glued to the upper plate.

13. The panel according to claim 11, wherein the photovoltaic cells are built directly on the upper plate by vacuum deposition methods.

14. The panel according to claim 1, wherein the recess extends to the upper transverse edge of the panel.

15. The panel according to claim 1, wherein the opening is located in an upper half of the upper overlap area.

16. The panel according to claim 1, wherein the perforation is located in a lower quarter of the lower overlap area.

17. A panel comprising:
an upper transverse edge including an upper overlap area intended to be covered by an adjacent panel;
a lower transverse edge including a lower overlap area intended to cover a further adjacent panel;
a first longitudinal edge including a first longitudinal rib;
a central part extending from the first longitudinal rib, including:
a recess located in the upper overlap area including an opening; and
a perforation in the lower overlap area for passing through an electrical connector; and
a second longitudinal edge extending from the central part including a second longitudinal rib,
the first longitudinal rib and the second longitudinal rib having shapes enabling them to overlap,
wherein the recess is laterally centered on the upper plate.

18. A roof comprising:
a first panel according to claim 1; and
at least a second panel according to claim 1;
a portion of the first panel overlapping the at least second panel.

* * * * *